(12) United States Patent
Komoda

(10) Patent No.: US 7,496,491 B2
(45) Date of Patent: Feb. 24, 2009

(54) DELAY CALCULATION METHOD CAPABLE OF CALCULATING DELAY TIME WITH SMALL MARGIN OF ERROR

(75) Inventor: Michio Komoda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 312 days.

(21) Appl. No.: 11/174,542

(22) Filed: Jul. 6, 2005

(65) Prior Publication Data

US 2006/0015278 A1 Jan. 19, 2006

(30) Foreign Application Priority Data

Jul. 14, 2004 (JP) ............... 2004-207191

(51) Int. Cl.
*G06F 17/50* (2006.01)
*G06G 7/48* (2006.01)

(52) U.S. Cl. ............................. 703/19; 716/6

(58) Field of Classification Search .................. 703/13, 703/14, 19; 716/6
See application file for complete search history.

(56) References Cited

U.S. PATENT DOCUMENTS 6,629,299 B1 * 9/2003 Iwanishi .................... 716/6
6,750,676 B1 * 6/2004 Honda ....................... 326/81
7,126,408 B2 * 10/2006 Zerbe ........................ 327/336
7,225,418 B2 * 5/2007 Shimazaki et al. ........... 716/6
2005/0278671 A1 * 12/2005 Verghese et al. ............. 716/6

FOREIGN PATENT DOCUMENTS

JP 2002-123568 A 4/2002

OTHER PUBLICATIONS

Bharadwaj S. Amrutur, Design and Analysis of Fast Low Power SRAMs, Aug. 1999.*
Agilent 85123A, RF Precision Modelling System, Installation and User's Guide, 2002.*
Zhang et al. (A delay Model and Optimization method of a Low-Power BiCMOS Logic Circuit, Oct. 1994).*

* cited by examiner

*Primary Examiner*—Paul L Rodriguez
*Assistant Examiner*—Andre Pierre Louis
(74) *Attorney, Agent, or Firm*—McDermott Will & Emery LLP

(57) ABSTRACT

A delay calculation method that is capable of calculating delay time with a small margin of error is provided for delay calculation in a logic circuit. The operating characteristics of transistor are expressed with a fixed resistance and a power supply voltage that changes with time. The power supply voltage is represented as a waveform which is a combination of two straight lines: the one indicating that the voltage, after a fixed delay of t0, increases to V1 during Δt1; and the one indicating that the voltage increases from V1 to E during Δt2 and thereafter remains at the fixed value of E. A difference in the shapes of input waveforms is adopted as a correction parameter to determine the values of Δt1, V1, and Δt2.

5 Claims, 9 Drawing Sheets

F I G . 1 2
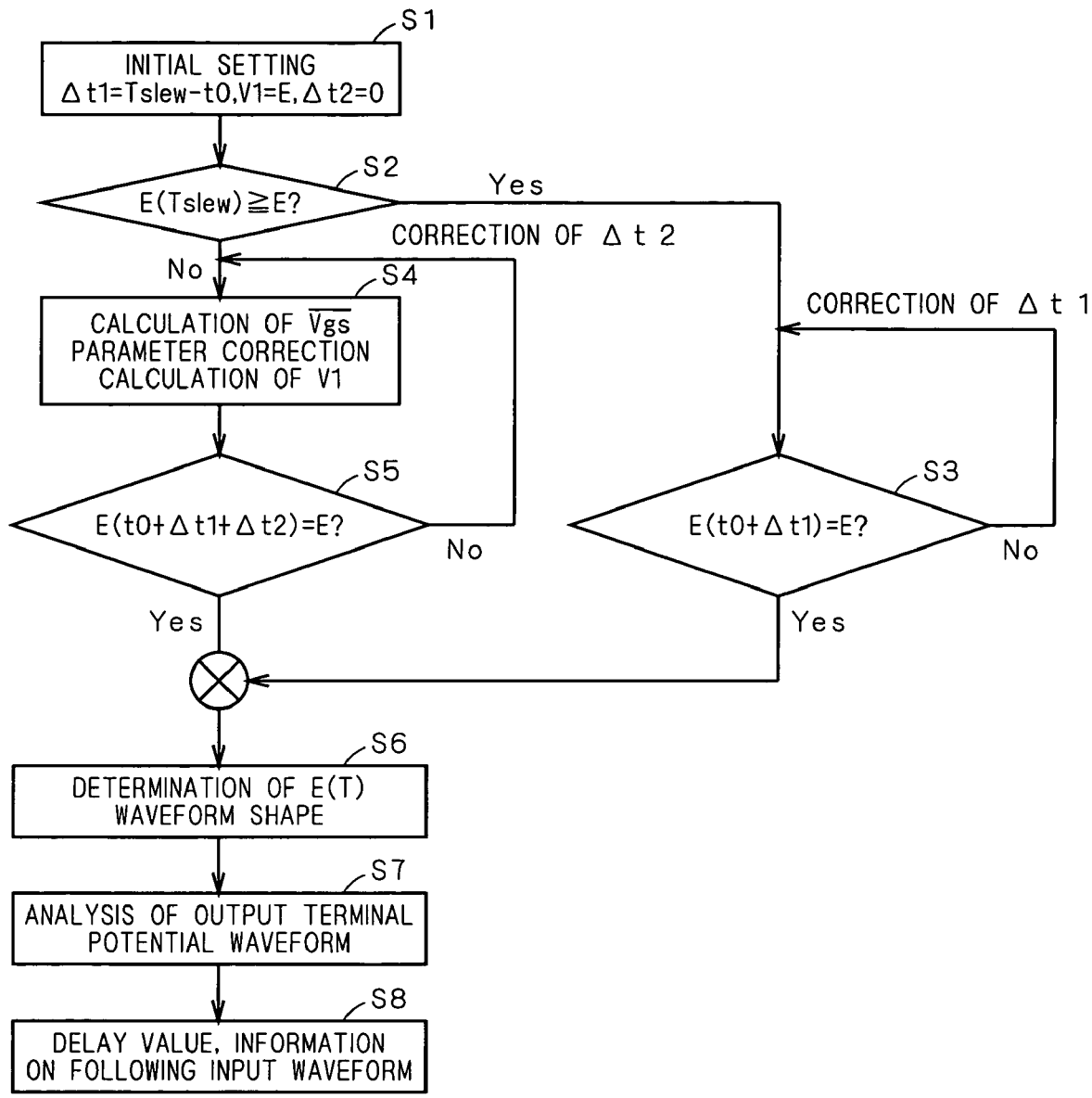

DELAY CALCULATION METHOD CAPABLE OF CALCULATING DELAY TIME WITH SMALL MARGIN OF ERROR

BACKGROUND OF THE INVENTION

1. Field of the Invention

The present invention relates to a delay calculation method for calculating delay time of, for example, each macrocell with transistors.

2. Description of the Background Art

For timing verification of semiconductor integrated circuits (SOC: System on Chip) equipped with large-scale systems, delay time in each instance must be calculated with accuracy. One of well-known high-precision delay calculation methods is that using circuit simulations such as SPICE. In circuit simulations, the analysis of operating points of each device is made on matrix calculation. This calculation is conducted at each lapse of a very short time to obtain a voltage value at every node. In this technique, a huge matrix must be analyzed for the analysis of operation at a certain time, so an increase in the number of devices will markedly increase the amount of calculation. Further, the necessity of conducting matrix calculation at each lapse of a very short time makes impossible to conduct an analysis within a realistic time, for semiconductor integrated circuits which include an extremely large number of devices such as large-scale SOCs. To solve this problem, another delay calculation method using a delay calculator has been employed.

The delay calculator previously adds an input waveform generating circuit and an output load respectively to the input and output of every macrocell (logic circuit) that can cause a delay, and it conduct circuit simulations (SPICE) using a plurality of kinds (usually 10 to 100) of input waveforms and output load capacitances. At this time, every input waveform is replaced and represented as time (a Tslew value) required for transition from low to high state (or high to low state).

From simulation results obtained here, parameters which are necessary for calculating delay time as a function of the Tslew value and the output load capacitance are extracted and stored in a delay-parameter database. This is done for each path when each macrocell has a plurality of different changing paths.

Using the delay-parameter database created in this way, the delay calculator performs delay calculations on a SOC. First, delay time in the instance where the Tslew value is set by default or by the designer is calculated using the delay-parameter database. For delay calculation, information on the output load is necessary, and it can be produced in advance from layout results obtained with a layout extractor. By so doing, delay time and an output waveform in that instance can be determined. Since the Tslew value to be inputted in the following instance can be determined from the output waveform, the delay time and the output waveform for the following instance can be determined using this Tslew value. This operation is performed for all instances, whereby any delay time in the SOC can be calculated.

For example, Japanese Patent Application Laid-open No. 2002-123568 has disclosed one of the delay calculation methods for calculating delay time only from Tslew values and output load information.

However, in real SOCs, depending on the topology of a circuit or RC network to be configured, there are various shapes of input waveforms that differ from the one used to create the delay-parameter database. That is, there exist a lot of input waveforms that have the same Tslew value but have different waveform shapes.

In conventional delay calculation methods, delay time is calculated only from Tslew values and output load information. Thus, in the case where the output load capacitance is the same and each input waveform has the same Tslew value, the same delay time is calculated for different shapes of input waveforms.

Consequently, the results of delay calculations in conventional delay calculation methods have a margin of error of around 8 percent even if parameters are optimized somehow. At present, SOCs become faster, so a margin of error in delay calculation must be kept at 5 percent at most. From this, the 8-percent inherent margin of error has made circuit design difficult.

SUMMARY OF THE INVENTION

It is an object of the present invention to provide a delay calculation method for calculating delay time with a small margin of error.

The present invention is intended for a delay calculation method for a logic circuit including a MOS transistor, the transistor being modeled using a resistance element whose resistance value is fixed and a power supply whose voltage varies with time. A shape of a voltage waveform of the power supply is determined according to input waveform information that determines the shape of an input waveform inputted to the logic circuit.

Since the shape of the voltage waveform of the power supply which models the transistor is determined according to parameters that determine the shape of the input waveform, delay time can be calculated with a small margin of error.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a flow chart for explaining a delay calculation method according to the preferred embodiment of the present invention.

DESCRIPTION OF THE PREFERRED EMBODIMENTS

Like conventional delay calculation methods, a delay calculation method according to a preferred embodiment of the present invention inputs a Tslew value of an input waveform, delay parameters for calculating delay time as a function of the Tslew value and an output load capacitance, and output load information. The delay calculation method of this preferred embodiment further inputs input waveform information that gives the shapes of input waveforms. The method then outputs a delay time, the following input waveform, and the Tslew value of the following input waveform.

Figure 1:
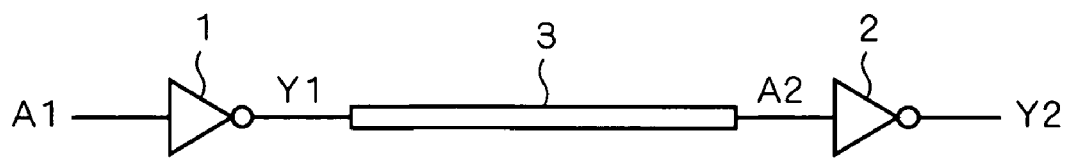
FIG. 1 shows the sampling of circuit connection information according to a preferred embodiment of the present invention.
Figure 2:
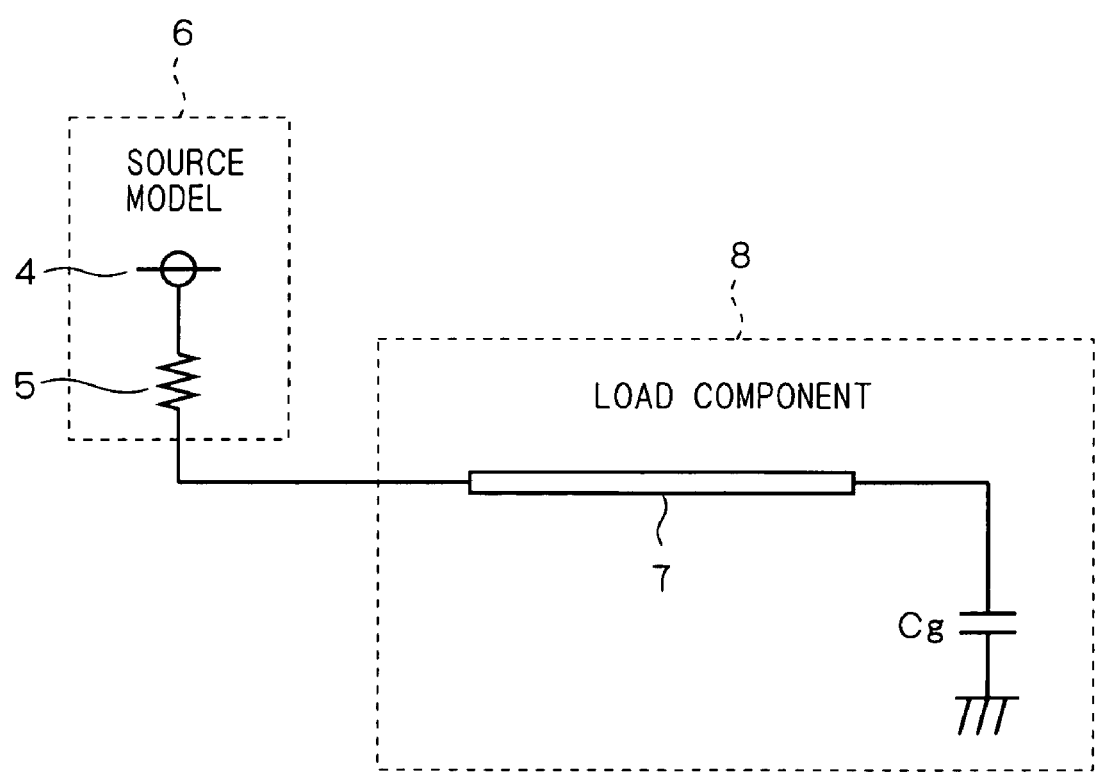
FIG. 2 illustrates the structure of circuit configuration information.
Figure 3:
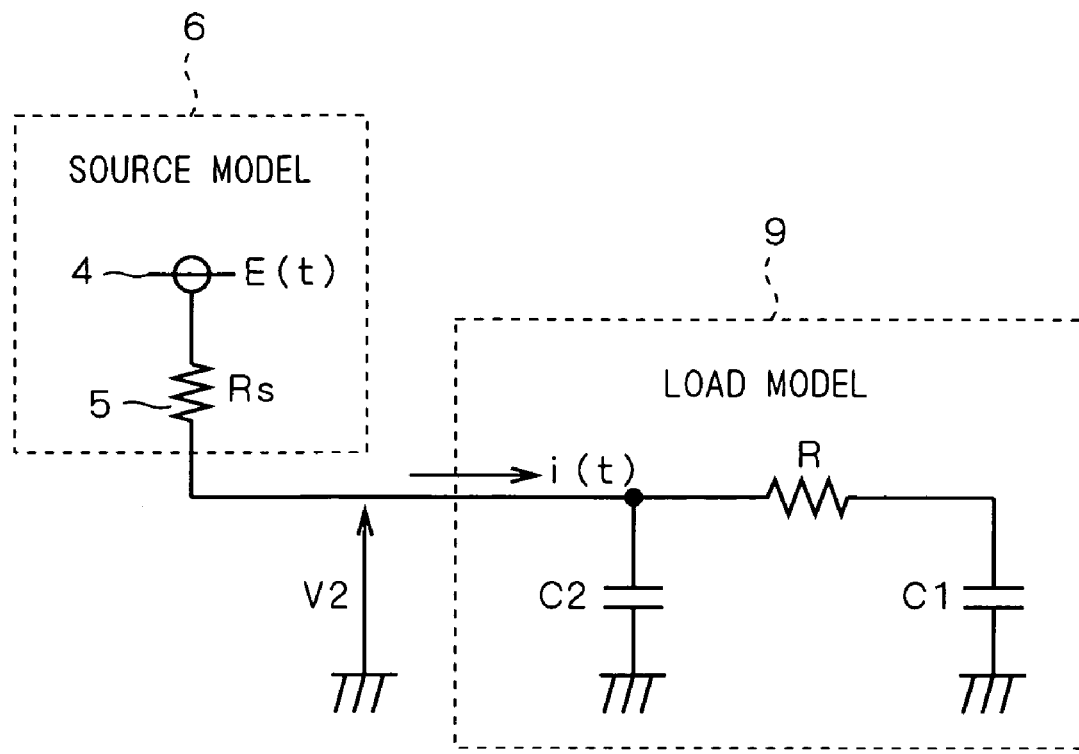
FIG. 3 is a schematic diagram of a load model.
Figure 4:
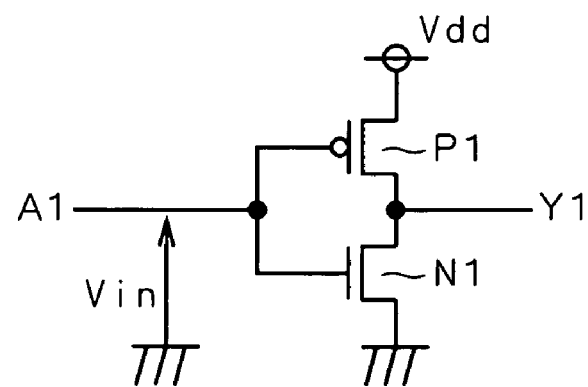
FIG. 4 is a schematic diagram of an inverter.

FIGS. 1 to 3 shows the processing flow of delay calculation according to this preferred embodiment. FIG. 1 shows a configuration of circuit connection, for example when inverters 1 and 2 are connected through an interconnect line 3. FIG. 4 shows the structure of the inverter 1. As shown in FIG. 4, the inverter 1 is formed of a PMOS transistor P1 and an NMOS transistor N1. A power supply voltage Vdd is applied to the source of the PMOS transistor P1. The drain of the PMOS transistor P1 is connected to the drain of the NMOS transistor N1 and to an output terminal Y1. The source of the NMOS transistor N1 is grounded. The gates of the PMOS and NMOS transistors P1 and N1 are connected to an input terminal A1. The structure of the inverter 2 is identical and thus not described here.

As shown in FIG. 2, circuit configuration information is generated based on circuit connection information shown in FIG. 1. The circuit configuration information consists of a source model 6 corresponding to the inverter 1, and a load component 8. The source model 6 includes a power supply 4 and a resistor 5, in which the resistor 5 has its one end connected to the power supply 4 and its other end connected to one end of an RC distributed constant circuit 7 forming the load component 8.

The load component 8 includes the RC distributed constant circuit 7 corresponding to the interconnect line 3, and an input pin capacitor Cg. The RC distributed constant circuit 7 has its one end connected to the source model 6 and its other end connected to one end of the input pin capacitor Cg. The other end of the input pin capacitor Cg is grounded.

Next, as shown in FIG. 3, a load model 9 which is equivalent to the circuit configuration information is generated. The load model 9 consists of capacitors (capacitances) C1 and C2, which are respectively output and input capacitances of the RC distributed constant circuit 7, and a resistor (resistance) R of the RC distributed constant circuit 7 in the load component 8. One end of the resistor R is connected to one end of the input capacitor C2 and to the other end of the resistor 5 of the source model 6. The other end of the input capacitor C2 is grounded. The other end of the resistor R is connected to one end of the output capacitor C1, and the other end of the output capacitor C1 is grounded.

According to the present invention, the power supply 4 of the above-configured source model 6 is designed to have time dependency (hereinafter, the magnitude of voltage at the power supply 4 is indicated by E(t)). Then, a model (referred to as an "E(t) model") that represents transistor operation when an input waveform is received is constructed. That is, the E(t) model is a model that determines the shape of the waveform of E(t) (hereinafter referred to as the "E(t) waveform") so that the output current i(t) of the source model 6 flowing to the load model 9 reproduces the waveform of the drain current Ids of the transistors forming the inverter 1. Thus, the shape of the E(t) waveform is determined by taking into account the waveform of the drain current Ids of the transistors.

Now, the waveform of the drain current Ids will be described. The following description is for the case where the input waveform (input signal) that transitions from high to low is inputted from the input terminal A1. The shape of the input waveform is assumed to linearly change from high (potential Vdd) to low (potential of 0 V).

At this time, the potential of the output terminal Y1 of the inverter 1 transitions from low to high, because the PMOS transistor P1 of the inverter 1 transitions from off to on and thereby the output load is charged.

Figure 5:
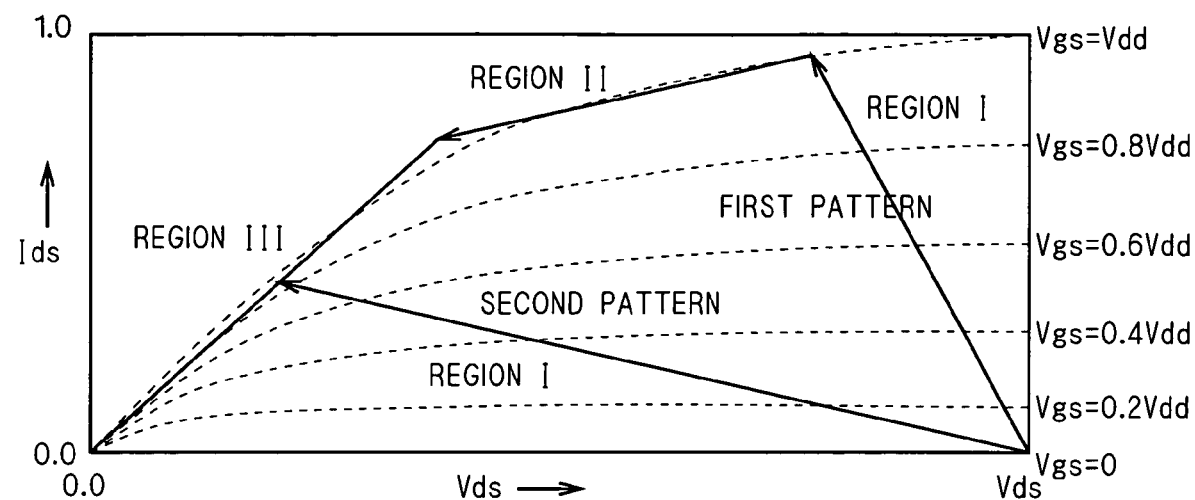
FIG. 5 shows current waveform patterns.

FIG. 5 is a diagram for explaining the waveform of the drain current Ids through the PMOS transistor P1 when an input waveform that transitions from high to low is inputted to the input terminal A1 of the inverter 1. The horizontal axis shows the source-drain voltage (drain voltage) Vds, and the vertical axis shows the drain current Ids. Dashed lines show Ids-Vds curves of a transistor for different magnitudes of the gate-source voltage (gate voltage) Vgs.

As shown in FIG. 5, depending on the drive capability of each macrocell and the output load capacitance, the current waveform has two patterns: a first pattern in which region I where output current increases with time is followed by region II where output current decreases gradually and is then followed by region III where output current decreases linearly; and a second pattern in which region I where output current increases with time is immediately followed by region III where output current decreases rapidly and linearly.

The current waveform is described in more detail below. In the initial state, the gate voltage Vgs of the PMOS transistor P1 is 0 V, and since the output load is not charged, the drain voltage Vds equals Vdd.

First, we describe the case where the output load capacitance is large, i.e., where the degree of decrease in the drain voltage Vds with the charging of the output load is smaller than the degree of change in the gate voltage Vgs. As the input signal given to the input terminal A1 of the inverter 1 transitions from high to low, the gate voltage Vgs increases and the drain current Ids starts to flow through the PMOS transistor P1.

The magnitude of the drain current Ids increases with increasing gate voltage Vgs. Also, the drain voltage Vds drops from Vdd with the charging of the output load with the drain current Ids. Since the larger the output load capacitance the smaller the degree of decrease in the drain voltage Vds, the PMOS transistor P1 goes into its saturation region when the gate voltage Vgs reaches Vdd (region I). Region I is hereinafter also referred to as the "saturation region with varying gate voltage" or "first region where current changes with varying gate voltage".

Then, the drain voltage Vds decreases gradually with the charging of the output load, whereby the drain current Ids decreases gradually while the magnitude of the gate voltage Vgs is constant (region II). Region II is hereinafter also referred to as the "saturation region with fixed gate voltage" or "second region where current decreases gradually while the gate voltage is constant".

Then, when the output load is further charged and the drain voltage Vds decreases to a certain degree, the PMOS transistor P1 goes into its linear region where the drain current Ids decreases linearly. When the charging of the output load is complete, the drain voltage Vds becomes 0 V and the drain current Ids stops flowing (region III). Region III is hereinafter also referred to as the "linear region" or "third region where current decreases while the gate voltage is constant".

As above described, when the output load capacitance is large, the current waveform is as shown by the first pattern in FIG. 5.

Next, we describe the case where the output load capacitance is small, i.e., where the degree of decrease in the drain voltage Vds with the charging of the output load is greater than the degree of change in the gate voltage Vgs. When the output load capacitance is somewhat small, region II will disappear. For example, consider the case where, when the gate voltage Vgs reaches Vdd, the output load is charged to a certain extent and the transistor goes into its linear region. In this case, the drain current Ids increases toward region III as shown in FIG. 5 with increasing gate voltage Vgs (region I), and then rapidly decreases after the gate voltage Vgs reaches Vdd (region III).

When the output load capacitance becomes further smaller, the transistor moves from region I to region III before the gate voltage Vgs reaches Vdd. The second pattern shown in FIG. 5 is such a pattern that the output load capacitance is small and thus, the transistor moves from region I to region III before the gate voltage Vgs reaches Vdd.

Next, we discuss the E(t) waveform that reproduces the current waveform described above. Firstly discussed is the first pattern of the current waveform. On the line of the first pattern, region III is a linear region where the current flowing is determined by the time constant of a circuit, so that E(t)=E (=Vdd). Since the source model 6 represents transistor operation by E(t) and the value of the resistor 5, and current in region III decreases linearly with decreasing drain voltage Vds, a current waveform that decreases linearly with time can be reproduced when E(t)=E.

Figure 6:
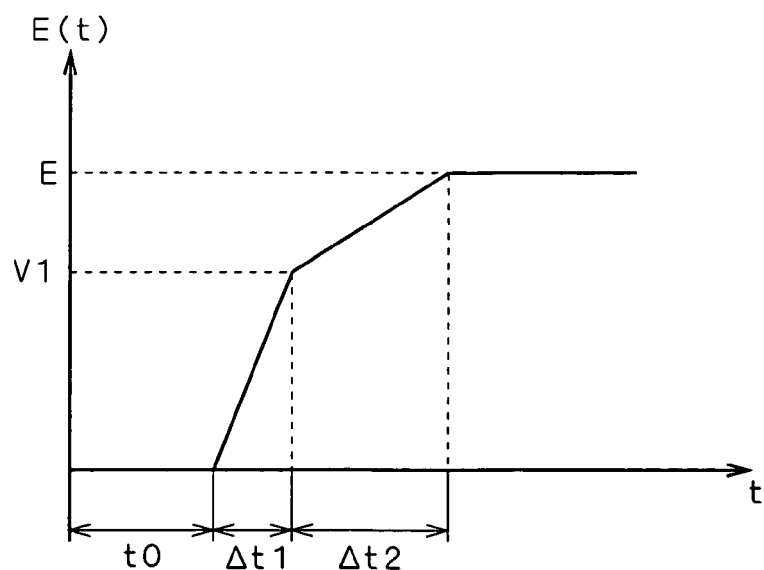
FIGS. 6 and 7 are characteristic curves showing the change in power supply voltage with time.

In regions I and II, different waveforms of E(t) are applied. For respective regions I and II, E(t) is represented by different functions of time (however, both the functions are continuous at a point of time corresponding to regions I and II). In this preferred embodiment, for ease of calculation, regions I and II are represented by continuous straight lines with different inclinations as shown in FIG. 6.

More specifically, region I corresponds to a region where the drain current Ids increases rapidly. To represent this drain current Ids in the source model 6, region I is brought into correspondence with a straight line with a high degree of inclination with respect to time.

Region II corresponds to a region where the drain current Ids degreases gradually while the magnitude of the gate voltage Vgs is constant at Vdd. To reproduce this gradually decreasing drain current Ids in the source model 6, region II must be brought into correspondence with a straight line indicating that voltage increases with time because the voltage applied to one end of the resistor 5 increases with the charging of the output load capacitance. If voltage is constant with respect to time, the rate of decrease in the drain current Ids becomes too high.

The time when E(t) starts to increase does not necessarily coincide with time t=0. The PMOS transistor P1 has a threshold voltage Vth, and current starts to flow when the input waveform meets and exceeds the threshold voltage Vth. Thus, E(t) starts to increase when the input waveform meets and exceeds the threshold voltage Vth. This duration of time is referred to as a fixed delay t0. Assuming that the time when the input waveform has finished its transition to 0 or Vdd is the Tslew value, the fixed delay t0 can be represented as a function of the Tslew value and can be approximated for example by the equation: $t0(Tslew)=K10+K20 \cdot Tslew^\alpha$. In this case, K10, K20, $\alpha$ are delay parameters which are stored in the delay-parameter database as function information concerning an input slew rate that determines the fixed delay t0.

According to this preferred embodiment, as shown in FIG. 6, the E(t) waveform is plotted as a line graph, showing that, after a lapse of the fixed delay t0, E(t) increases first to V1 during $\Delta t1$ and then to E during $\Delta t2$, where t0, $\Delta t1$, V1, and $\Delta t2$ are the parameters.

Figure 7:
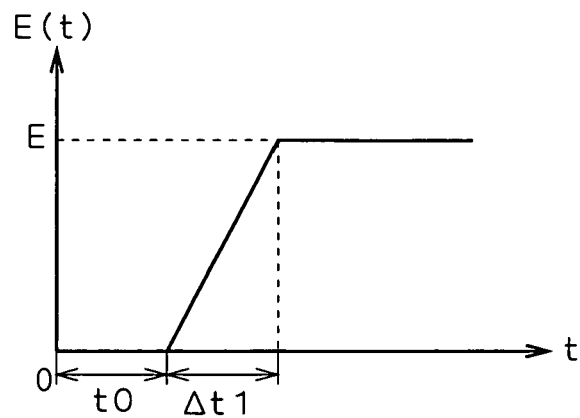

In the case of the second pattern, region II does not exist. In this case, assuming that $\Delta t2=0$ and V1=E, the E(t) waveform is such that region I directly moves to region III (FIG. 7).

When using the E(t) waveform shown in FIG. 6, the waveform of an output terminal voltage V2(t) (c.f. FIG. 3) during the rise of the E(t) waveform can be expressed as follows.

If functions $f$ and $\alpha$ are defined as:

$$\begin{cases} f(t, \Delta t, V) = \left\{ t - \dfrac{z}{p_1 p_2} + \dfrac{p_1 - z}{p_1(p_1 - p_2)} \exp(-p_1 t) - \\ \qquad\qquad \dfrac{p_2 - z}{p_2(p_1 - p_2)} \exp(-p_2 t) \right\} \dfrac{V}{\Delta t} \\ a(t, V) = \left\{ 1 - \dfrac{p_1 - z}{p_1 - p_2} \exp(-p_1 t) + \dfrac{p_1 - z}{p_1 - p_2} \exp(-p_2 t) \right\} V \end{cases} \quad (1)$$

where $$\begin{cases} z = \dfrac{1}{RC1} + \dfrac{1}{RC2} \\ p_1, p_2 = \dfrac{1}{2} \left\{ \left( \dfrac{1}{RC1} + \dfrac{1}{RC2} + \dfrac{1}{RsC2} \right) \pm \\ \qquad\qquad \sqrt{\left( \dfrac{1}{RC1} + \dfrac{1}{RC2} + \dfrac{1}{RsC2} \right)^2 - \dfrac{4}{RRsC1C2}} \right\} \end{cases} \quad (2)$$

a model waveform of V2(t) can be expressed as follows:

when $\Delta t1=0$, $$V2(t) = \begin{cases} 0 & (0 \le t \le t0) \\ a(t-t0, V1) + f(t-t0, \Delta t2, E-V1) & (0 < t \le t0 + \Delta t2) \\ a(t-t0, V1) + f(t-t0, \Delta t2, E-V1) - \\ \qquad f(t, -t0 - \Delta t2, \Delta t2, E-V1) & (t > t0 + \Delta t2) \end{cases} \quad (3)$$

and when $\Delta t2=0$, $$V2(t) = \begin{cases} 0 & (0 \le t \le t0) \\ f(t-t0, \Delta t1, E) & (0 < t \le t0 + \Delta t1) \\ f(t-t0, \Delta t1, E) + f(t-t0-\Delta t1, \Delta t1, E) & (t > t0 + \Delta t1) \end{cases} \quad (4)$$

and when $\Delta t1 \ne 0$ and $\Delta t2 \ne 0$, $$V2(t) = \begin{cases} 0 & (0 \le t \le t0) \\ f(t-t0, \Delta t1, V1) & (0 < t \le t0 + \Delta t1) \\ f(t-t0, \Delta t1, V1) - \\ \quad f(t-t0-\Delta t1, \Delta t1, V1) + & (t0 + \Delta t1 < t \le t0 + \\ \quad f(t-t0-\Delta t1, \Delta t2, E-V1) & \Delta t1 + \Delta t2) \\ f(t-t0, \Delta t1, V1) - \\ \quad f(t-t0-\Delta t1, \Delta t1, V1) + \\ \quad f(t-t0-\Delta t1, \Delta t2, E-V1) - & (t > t0 + \Delta t1 + \Delta t2) \\ \quad f(t-t0-\Delta t1, \Delta t2, E-V1) \end{cases} \quad (5)$$

The procedures for determining the values $\Delta t1$, V1, and $\Delta t2$ are described below. Looking at the shifts of operating points of the transistor shown in FIG. 5, there are three boundary points from region I to region II, from region I to region III, and from region II to region III. These operating points of the transistor are all on the Ids-Vds characteristic curve where Vgs=Vdd. In other words, the Ids-Vds characteristic curve where Vgs=Vdd is only required for determination of the boundary condition.

Figure 8:
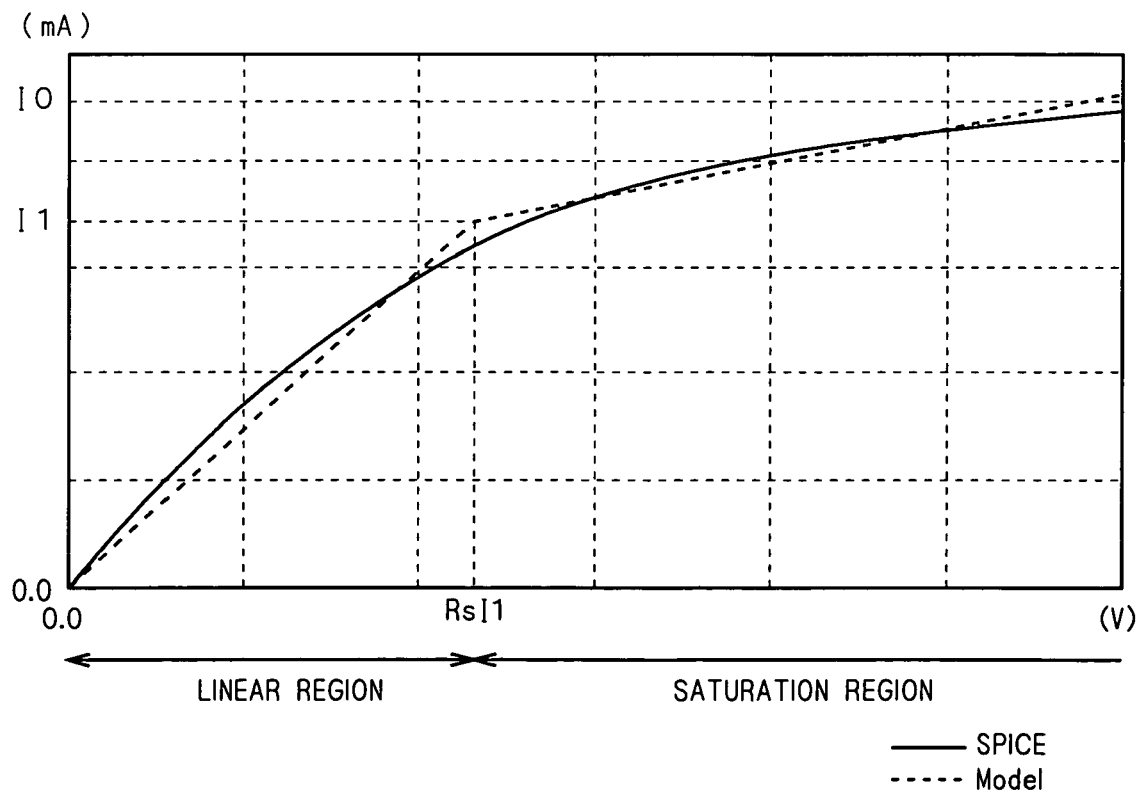
FIG. 8 shows the Ids-Vds characteristic curve of an E(t) model.

The Ids-Vds characteristic curve where Vgs=Vdd is modeled as shown in FIG. 8, using the resistance, Rs, of the resistor 5 and current parameters I0 and I1.

FIG. 8 shows the result of SPICE simulations when Vgs=Vdd, and a model representing the result by current parameters.

The source model 6 charges and discharges the output load through the resistor 5 (with the resistance Rs). Thus, the Ids-Vds characteristics of region III must be expressed by Ids=Vds/Rs. The saturation current at the boundary point between region II and region III is represented by the current parameter I1, and the saturation current where Vds=Vdd is represented by the current parameter I0.

For this E(t) model, since the saturation current at the boundary point between region II and region III is represented by I1, a region where Vds≦Rs·I1 is referred to as the linear region, and a region where Vds>Rs·I1 as the saturation region. Further, by separately defining the saturation current where Vds=Vdd as I0, the saturation current in region II is represented by I0 and I1 as later described, to express the characteristics that the drain current Ids decreases gradually with decreasing drain voltage Vds (or with increasing output terminal voltage V2) in the saturation region.

Figure 9:
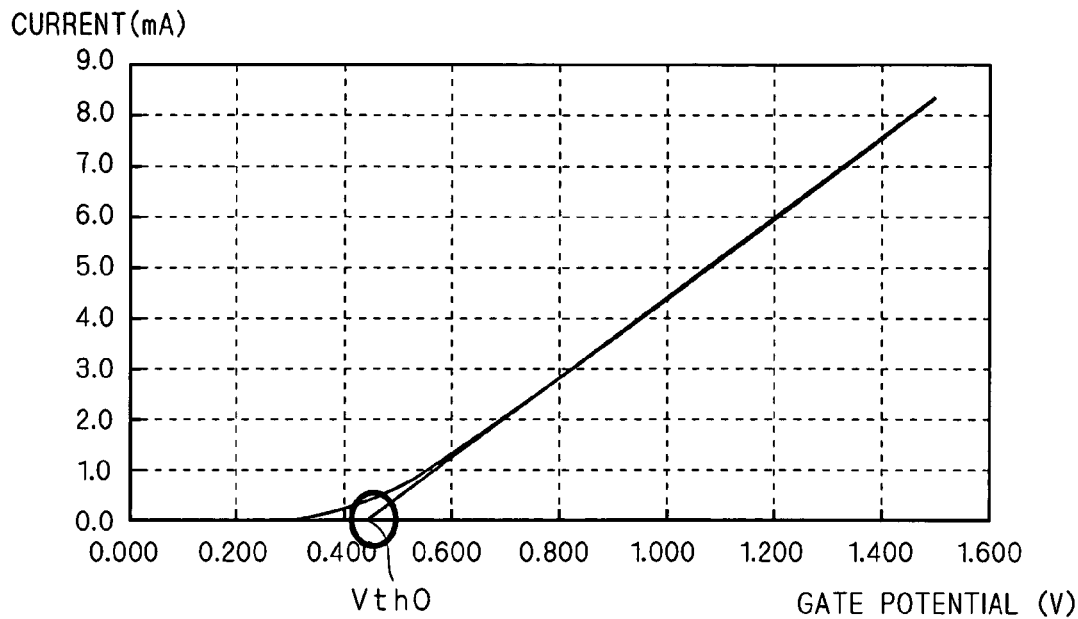
FIG. 9 shows a characteristic curve defining the relationship between gate voltage and saturation current.

The values of Δt1, V1, and Δt2 are described using parameters Rs, I0, and I1 which has previously been extracted. Also, as shown in FIG. 9, the relationship between the gate voltage and the current across the transistor is approximated by a straight line, and a point of intersection of this straight line and the axis of the gate potential is defined as Vth0 and registered in the delay-parameter database.

Next, a concrete calculation method for determining the shape of the E(t) waveform is described.

<1. Determination of Δt1>

Firstly, Δt1 is determined. For determination of Δt1, initial values, Δt1=Tslew−t0, V1=E, and Δt2=0, are given. This is equivalent to assuming that E(t) takes the shape as shown in FIG. 7, and the transistor transitions from the saturation to the linear region when t=Tslew=t0+Δt1.

At this time, when t=Tslew, the PMOS transistor P1 is at the boundary point between its saturation and linear regions. As previously described, the current in this condition is registered as I1 in the delay-parameter database.

In the description of FIG. 5, the shape of the input waveform is assumed to linearly change from high (potential Vdd) to low (potential of 0 V). Thus, modeling using the current parameters shown in FIG. 8 is also made assuming that the waveform shape changes linearly.

Figure 10:
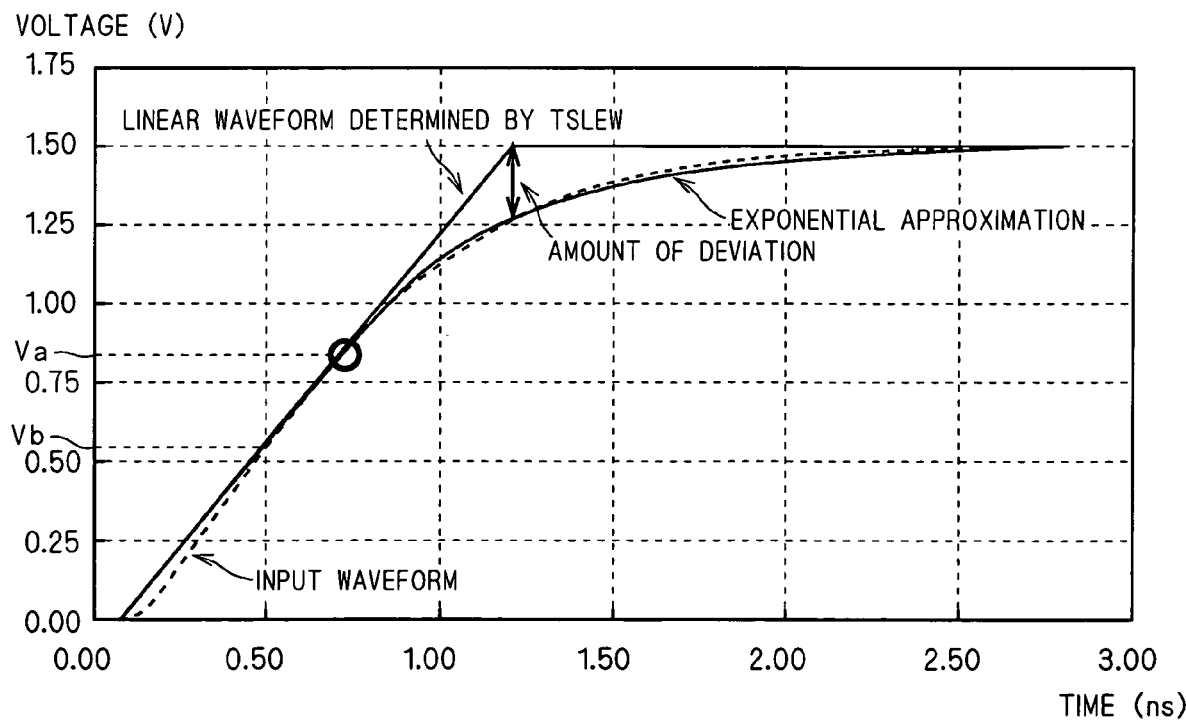
FIG. 10 shows an example of actual input waveforms along with its approximate line.

However, as shown in FIG. 10, actual input waveforms will deviate from the linear waveform. FIG. 10 shows one example of actual input waveforms. While FIG. 10 shows an example of input waveforms that transition from low to high, the following description also applies to input waveforms that transition from high to low.

Now, two points Va and Vb of potential are selected which determine the inclination of the actual input waveform. At a time when a linear waveform which passes through these two points meets the power supply voltage Vdd (or the ground potential GND when the input waveform transitions from low to high), the rate of the amount of deviation of the linear waveform from the actual input waveform to the power supply voltage Vdd (this rate is hereinafter referred to as "TinDrop") is measured to form an exponential waveform (with a time constant TinTau) which passes through the point of deviation (the point on the linear waveform at time Tslew) and a higher one of the potential points used to determine the inclination of the input waveform (e.g., Va in the example of FIG. 10) (or a lower one Vb of the potential points when the input waveform transitions from low to high). This waveform can be expressed by only TinDrop and TinTau, which two quantities are thus defined as input waveform information.

As shown by way of example in FIG. 10, when t=Tslew, the gate voltage Vgs takes a value that drops by the amount calculated from Tindrop×E. Thus, actual current when t=Tslew is expressed as d·I1, which is the product of the current parameter I1 and a correction factor d expressed as follows:

$$d = \frac{(1-TinDrop)E - Vth0}{E - Vth0} \quad (6)$$

Using the equation of V2(t) when Δt2=0, the following equation holds true for E(t) where t=Tslew.

$$E(Tslew)=V2(Tslew)+dI1Rs=E \quad (7)$$

However, the fact is that the initial values (Δt1=Tslew−t0, V1=E, and Δt2=0) are not always a solution that satisfies equation (7). Thus, the result can be E(Tslew)>E or E(Tslew)<E.

First, the case where E(Tslew)≧E indicates that t≦Tslew, where t is the time when the saturation region with varying gate voltage Vgs (region I) transitions to the linear region (region III). More specifically, the case where E(Tslew)>E indicates that the value of the term, V2(Tslew)+d·I1·Rs, of equation (7) is large. Thus, in order to satisfy equation (7), the current value at the boundary between region I and region III must be reduced to below I1. Referring to FIG. 5, the state as shown by the second pattern is required. The second pattern shows that, when t<Tslew, the transistor transitions from region I to region III before the gate voltage Vgs reaches Vdd. In other words, the second pattern corresponds to the case where the output load capacitance is small, showing with reference to FIG. 10 that the charging of the output load is completed before the increase in the gate voltage Vgs reaches the point of deviation between the linear waveform and the actual input waveform. Thus, exponential approximation is not necessary, and the liner waveform determined by the Tslew value can be used as the input waveform.

For the E(t) model, E(t0+Δt1)=E when t=t0+Δt1, the time corresponding to the boundary point between region I and region III. Thus, the following equation holds true:

$$V2(t0+\Delta t1)+Rsi(t0+\Delta t1)=E \quad (8)$$

Since we assume that this is the second pattern where Δt2=0, V2(t0+Δt1) can be expressed, using equation (4), as follows:

$$V2(t0+\Delta t1) = \left\{\Delta t1 - \frac{z}{p_1 p_2} + \frac{p_1 - z}{p_1(p_1 - p_2)}\exp(-p_1 \Delta t1) - \frac{p_2 - z}{p_2(p_1 - p_2)}\exp(-p_2 \Delta t1)\right\}\frac{E}{\Delta t1} \quad (9)$$

Here, i(t0+Δt1) is the current in the saturation region. The current i(t) is considered as follows: (1) In the simplest transistor model, the drain current in the saturation region is i∝(Vgs−Vth)$^2$, and it is i∝t$^2$ when Vgs is approximately expressed as a linear equation; (2) taking the fixed delay t0 into account, t must be t0 and i must be 0; and (3) using linear approximation, Vgs=Vdd when t=Tslew, showing the Ids-Vds characteristics of FIG. 8. The current value when t=Tslew is the current value I1 at the boundary between the linear and saturation regions when Vgs=Vdd. Thus, i(Tslew)=I1 when t=Tslew. The equation that satisfies this condition is as follows:

$$i(t) = I1 \left( \frac{t - t0}{Tslew - t0} \right)^2 \quad (10)$$

The current $i(t0+\Delta t1)$ can be expressed by this equation. Substituting equations (9) and (10) in equation (8) yields the following relation:

$$E(t0 + \Delta t1) = V2(t0 + \Delta t1) + \left( \frac{\Delta t1}{Tslew - t0} \right)^2 RsI1 = E \quad (11)$$

Further, substituting equation (9) for $V2(t0+\Delta t1)$ and changing the expression yields the following equation (12):

$$\left\{ -\frac{z}{p_1 p_2} + \frac{p_1 - z}{p_1(p_1 - p_2)} \exp(-p_1 \Delta t1) - \frac{p_2 - z}{p_2(p_1 - p_2)} \exp(-p_2 \Delta t1) \right\} E + \quad (12)$$

$$RsI1 \frac{\Delta t1^3}{(Tslew - t0)^2} = 0$$

This equation has one solution when $\Delta t1 > 0$.

Next, when $E(Tslew) < E$, the saturation current I1 must be increased conversely, and transistor operation transitions from the saturation region with varying gate voltage Vgs (region I) to the saturation region with fixed gate voltage Vgs (Vgs=E) (region II) and then to the linear region (region III). That is, the case corresponds to the first pattern of the current waveform shown in FIG. 5.

From the fact that Vgs=E at the boundary point between regions I and II and when considering the initial setting, E(t) reaches this boundary point when Tslew=t0+$\Delta t1$. When E(t) is expressed as shown in FIG. 6, the value of $\Delta t1$ is obtained from t0=Tslew–$\Delta t1$.

As another exception when solving equation (12), there is the case where $\Delta t1$=Tslew–t0$\leq$0. This case is understood to mean that Vgs=Vdd already when output current starts to flow, because it takes time to cause the flow of output current. The model in this state is considered to instantaneously move to the Ids-Vds characteristic curve where Vgs=Vdd. Thus, region I does not exist, and the model starts from region II. That is, $\Delta t1$=0.

In summary, $\Delta t1$ is as follows: (1) In the first case where Tslew–t0$\leq$0, $\Delta t1$=0; (2) In the second case where E(Tslew)$\geq$E, since t=t0+$\Delta t1 \leq$Tslew, $\Delta t1 \leq$Tslew–t0 and $\Delta t1$ satisfies the following equation:

$$\left\{ -\frac{z}{p_1 p_2} + \frac{p_1 - z}{p_1(p_1 - p_2)} \exp(-p_1 \Delta t1) - \frac{p_2 - z}{p_2(p_1 - p_2)} \exp(-p_2 \Delta t1) \right\} E + \quad (13)$$

$$RsI1 \frac{\Delta t1^3}{(Tslew - t0)^2} = 0$$

and (3) In the third case where E(Tslew)<E, $\Delta t1$=Tslew–t0.

<2. Determination of V1>

For V1, the following equation also holds true:

$$V2(t0+\Delta t1)+Rsi(t0+\Delta t1)=V1 \quad (14)$$

This equation is used for determining V1.

In the first case where $\Delta t1$=0, Vgs=Vdd already when t=t0. Thus, i(t0) is on the Ids-Vds characteristic curve of FIG. 6. Further, since the output load is not charged by definition of the fixed delay t0 and V2(t0)=0, Vds=Vdd and i(t0) must be I0. Accordingly, V1=Rs·I0. The second case where 0<$\Delta t1 \leq$Tslew–t0 corresponds to the second pattern in which region I transitions to region III, so that V1=E. The third case where $\Delta t1$=Tslew–t0 corresponds to the first pattern, indicating that region I transitions to region II at time Tslew. Since the output load is being charged during time $\Delta t1$, V2(t0+$\Delta t1$)>0. Further, V2(t0+$\Delta t1$)<E–Rs·I1 since the current flowing is greater than the drain current Ids at the boundary point between regions II and III.

Figure 11:
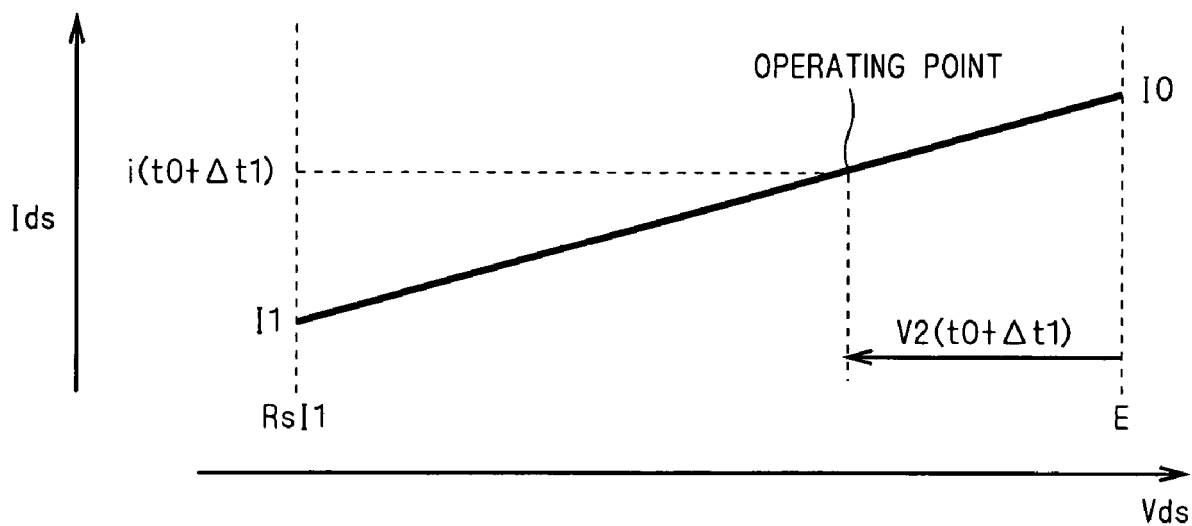
FIG. 11 is a diagram for explaining an operating point.

From the above description, it is found that V2(t0+$\Delta t1$) is in the following range: 0<V2(t0+$\Delta t1$)<E–Rs·I1. Thus, the operating point of the transistor is in the position shown in FIG. 11. FIG. 11 shows a portion corresponding to region II, which is extracted from FIG. 8. Referring to FIG. 11, the current value (saturation current value) in region II, i(t0+$\Delta t1$), can be expressed using the current parameters I0 and I1 as follows:

$$i(t0 + \Delta t1) = I0 - \frac{V2(t0 + \Delta t1)}{E - RsI1}(I0 - I1) \quad (15)$$

However, equation (15) is the equation obtained when the duration of time $\Delta t2$ corresponds to the "saturation region with fixed gate voltage", and the gate voltage Vgs is fixed at Vdd.

The actual input waveform, as shown in FIG. 10, has risen slightly according to the shape of the E(t) waveform. Thus, an error is produced if calculation is made by using the current value i(t0+t1) obtained on the assumption that Vgs=Vdd.

To reflect this error in the calculations of V1 and $\Delta t2$ which is to be described later, the mean gate voltage $\overline{Vgs}$ during $\Delta t2$ is calculated as follows:

$$\overline{Vgs} = E\left(1 - \frac{TinDrop \times TinTau}{\Delta t2}\left(1 - \exp\left(-\frac{\Delta t2}{TinTau}\right)\right)\right) \quad (16)$$

Here, when $\Delta t2$=0, $\overline{Vgs}$=E(1–TinDrop). Thus, when TinDrop=0, $\overline{Vgs}$=E.

Using this mean gate voltage $\overline{Vgs}$, the current parameters I0 and I1 in the delay-parameter database are corrected respectively to xI0 and xI1 for delay calculation.

Here, the correction factor x can be expressed by the following equation:

$$x = \frac{\overline{Vgs} - Vth0}{E - Vth0} \quad (17)$$

Substituting xI0 and xI1 respectively for I0 and I1 and using equation (15) for i(t0+$\Delta t1$), we find the value of V1 that satisfies the following equation:

$$Et(t0 + \Delta t1) = \quad (18)$$

$$V2(t0 + \Delta t1) + Rs\left(xI0 - \frac{V2(t0 + \Delta t1)}{E - xRsI1}(xI0 - xI1)\right) = V1$$

Further using equation (5), V2(t0+$\Delta t1$) can be expressed as:

$$V2(t0+\Delta t1) = \left\{\Delta t1 - \frac{z}{p_1 p_2} + \right. \quad (19)$$
$$\left. \frac{p_1-z}{p_1(p_1-p_2)}\exp(-p_1\Delta t1) - \frac{p_2-z}{p_2(p_1-p_2)}\exp(-p_2\Delta t1)\right\}\frac{V1}{\Delta t1}$$

From equations (18) and (19), V1 can be expressed as:

$$V1 = \frac{xRsI0}{1 - \frac{E-RsxI0}{E-RsxI1}\left\{\Delta t1 - \frac{z}{p_1 p_2} + \frac{p_1-z}{p_1(p_1-p_2)}\exp(-p_1\Delta t1) - \frac{p_2-z}{p_2(p_1-p_2)}\exp(-p_2\Delta t1)\right\}\frac{1}{\Delta t1}} \quad (20)$$

<3. Determination of $\Delta t2$>

Since the second case corresponds to the second pattern, $\Delta t2=0$. In the first and third cases, even at the boundary between regions II and III, the following equation holds:

$$Et(t0+\Delta t1+\Delta t2)=V2(t0+\Delta t1+\Delta t2)+xRsI1=E \quad (21)$$

Region II is the saturation region where Vgs=Vdd, and at the boundary between regions II and III, $i(t0+\Delta t1+\Delta t2)=x\cdot I1$. As the equation for determining $V2(t0+\Delta t1+\Delta t2)$, equation (3) (in the first case) or equation (5) (in the third case) is used as in the other cases. Then, the value of $\Delta t2$ is determined to satisfy equation (21).

From the above description, we summarize the equations for the values of $\Delta t1$, V1, and $\Delta t2$ as follows. In the first case where $Tslew-t0 \leq 0$, $\Delta t1=0$, $V1=RsI0$, and $\Delta t2$ satisfies the equation: $V2(t0+\Delta t1+\Delta t2)+xRs\cdot I1=E$. In the second case where $0<\Delta t1 \leq Tslew-t0$, $\Delta t1$ satisfies:

$$\left\{-\frac{z}{p_1 p_2} + \frac{p_1-z}{p_1(p_1-p_2)}\exp(-p_1\Delta t1) - \frac{p_2-z}{p_2(p_1-p_2)}\exp(-p_2\Delta t1)\right\}E + \quad (22)$$
$$RsI1\frac{\Delta t1^3}{(Tslew-t0)^2} = 0$$

and $V1=E$ and $\Delta t2=0$.

In the third case where $\Delta t1>Tslew-t0$, $\Delta t1=Tslew-t0$, V1 can be expressed as:

$$V1 = \frac{RsxI0}{1 - \frac{E-RsxI0}{E-RsxI1}\left\{\Delta t1 - \frac{z}{p_1 p_2} + \frac{p_1-z}{p_1(p_1-p_2)}\exp(-p_1\Delta t1) - \frac{p_2-z}{p_2(p_1-p_2)}\exp(-p_2\Delta t1)\right\}\frac{1}{\Delta t1}} \quad (23)$$

and $\Delta t2$ satisfies the equation: $V2(t0+\Delta t1+\Delta t2)+Rs\times I1=E$.

This solution remain unchanged regardless of the rise and fall of the waveform.

Next, the delay calculation method will be described with reference to a flowchart. FIG. 12 is a flowchart illustrating the flow of the delay calculation method according to the preferred embodiment of the present invention. In step S1, initial conditions are set as follows: $\Delta t1=Tslew-t0$, $V1=E$, and $\Delta t2=0$.

In step S2, E(Tslew) is calculated from equation (7). When $E(Tslew) \geq E$, the process goes to step S3 where $E(t0+\Delta t1)$ is calculated from equation (11). This calculation is repeated with different values of $\Delta t1$ until $E(t0+\Delta t1)=E$, thereby to determine the value of $\Delta t1$ that satisfies $E(t0+\Delta t1)=E$. Since the case where $E(Tslew) \geq E$ corresponds to the second pattern, the E(t) waveform is as shown in FIG. 7 and can be determined by determining the value of $\Delta t1$.

When $E(Tslew)<E$, the process goes to step S4, where the mean gate voltage $\overline{Vgs}$ is first calculated from equation (16). Then, using the mean gate voltage $\overline{Vgs}$, the correction factor x is calculated from equation (17). Then, the current parameters I0 and I1 are corrected respectively to xI0 and xI1, and V1 is calculated from equation (18).

The process then goes to step S5, where the calculation is repeated with different values of $\Delta t2$ until equation (21) holds true. Thereby, the value of $\Delta t2$ that satisfies equation (21) is determined.

Since the case where $E(Tslew)<E$ corresponds to the first pattern, the E(t) waveform can be determined by determining the values of V1, $\Delta t1$, and $\Delta t2$.

In step S6, the shape of the E(t) waveform is determined using the values of V1, $\Delta t1$, and $\Delta t2$ obtained in the above steps.

By determining the shape of the E(t) waveform in this way, the waveform of the output terminal voltage V2(t) of each macrocell can be obtained. In step S7, the waveform of the output terminal potential V2(t) is calculated using E(t). In the case where interconnection is implemented as an RC network, the potential waveform at the end of the interconnection can also be obtained by analyzing a time response at the end of the interconnection when V2(t) is applied to the output terminal of each cell. In step S8, a delay value and information on the following input waveform are calculated from the potential waveform at each node.

Figure 13:
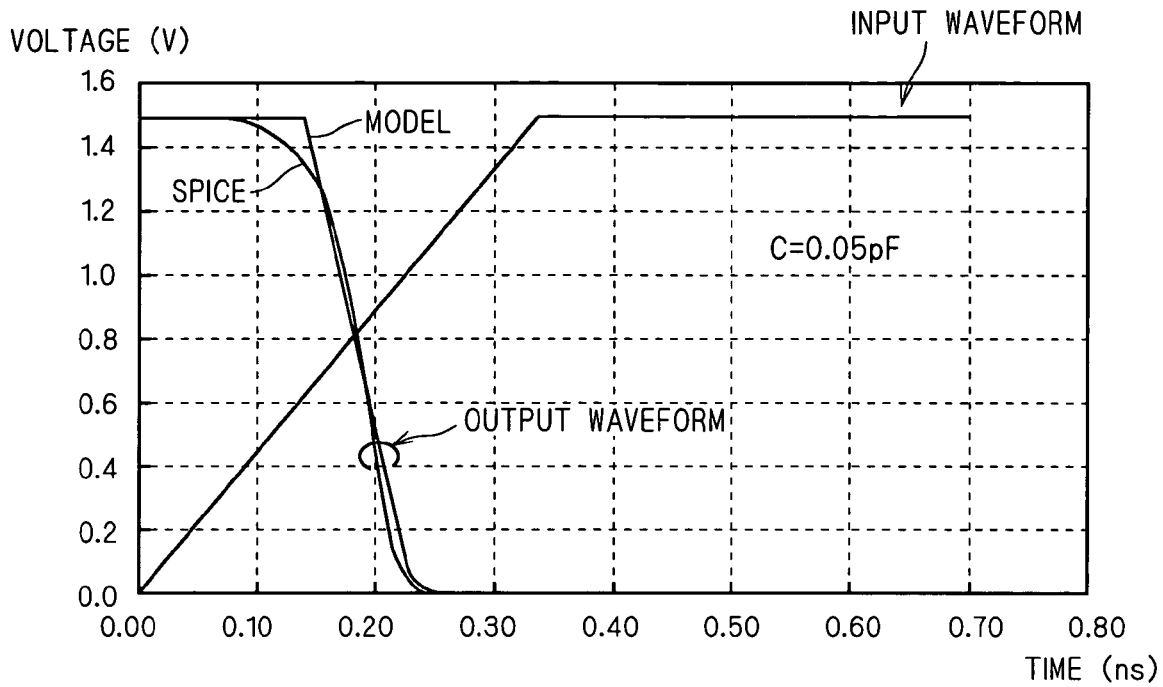
FIGS. 13 to 16 show the output waveform by the delay calculation method according to the preferred embodiment of the present invention, and the output waveform by SPICE.
Figure 14:
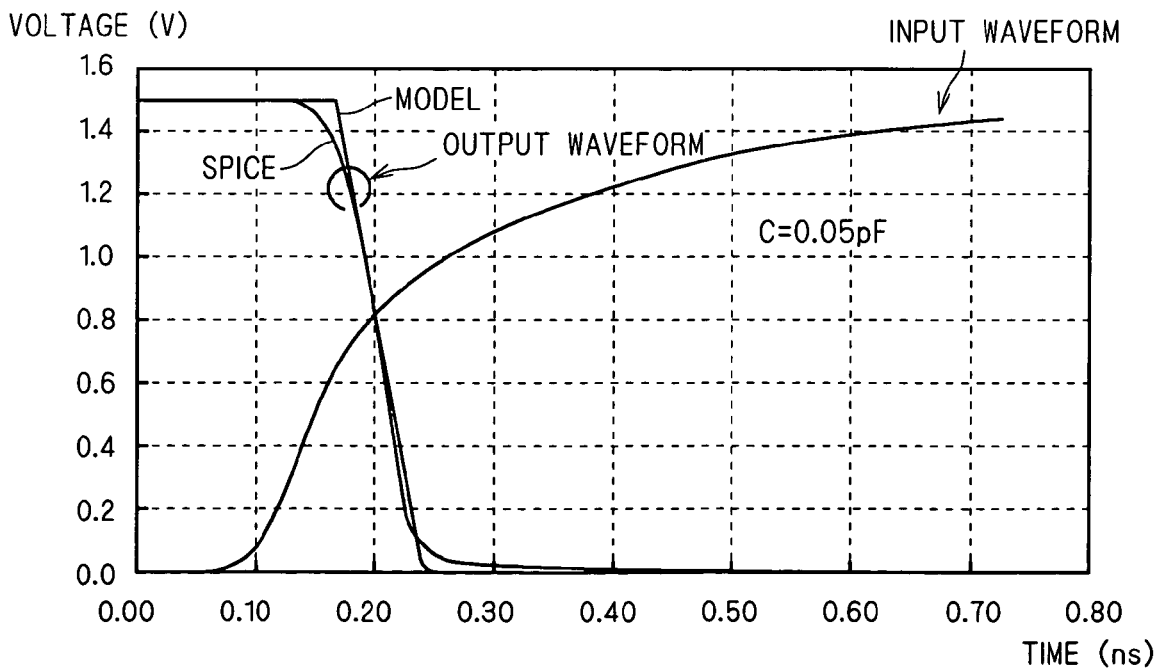
Figure 15:
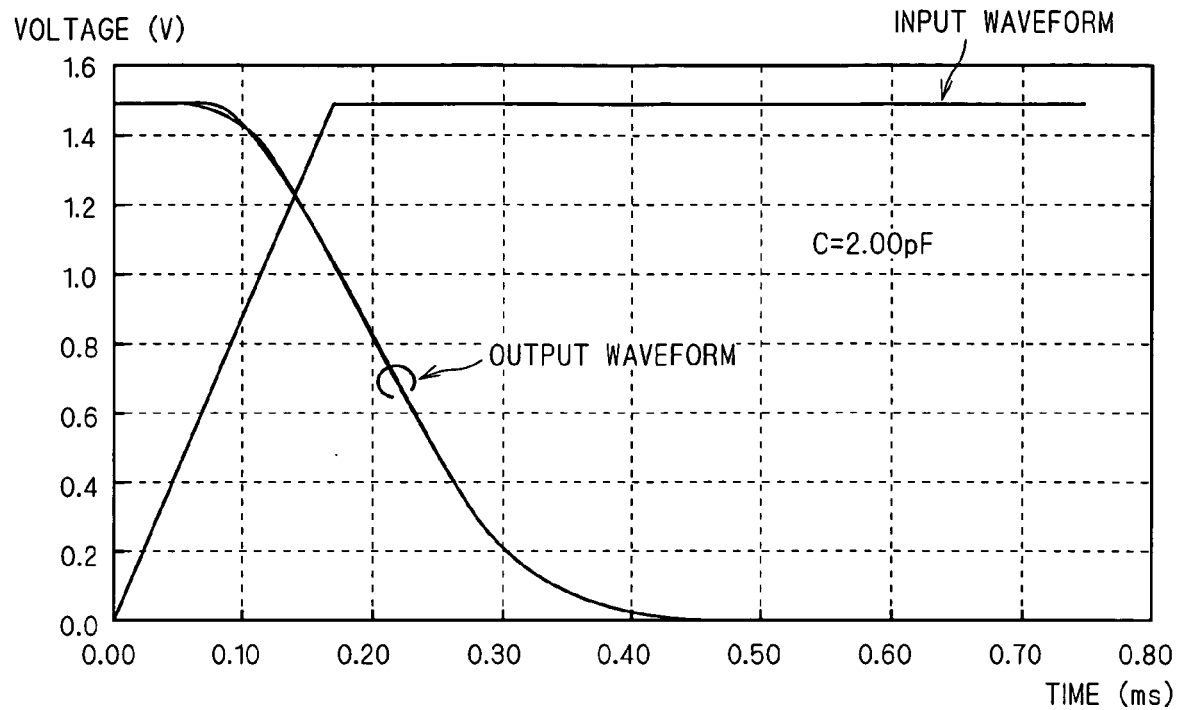
Figure 16:
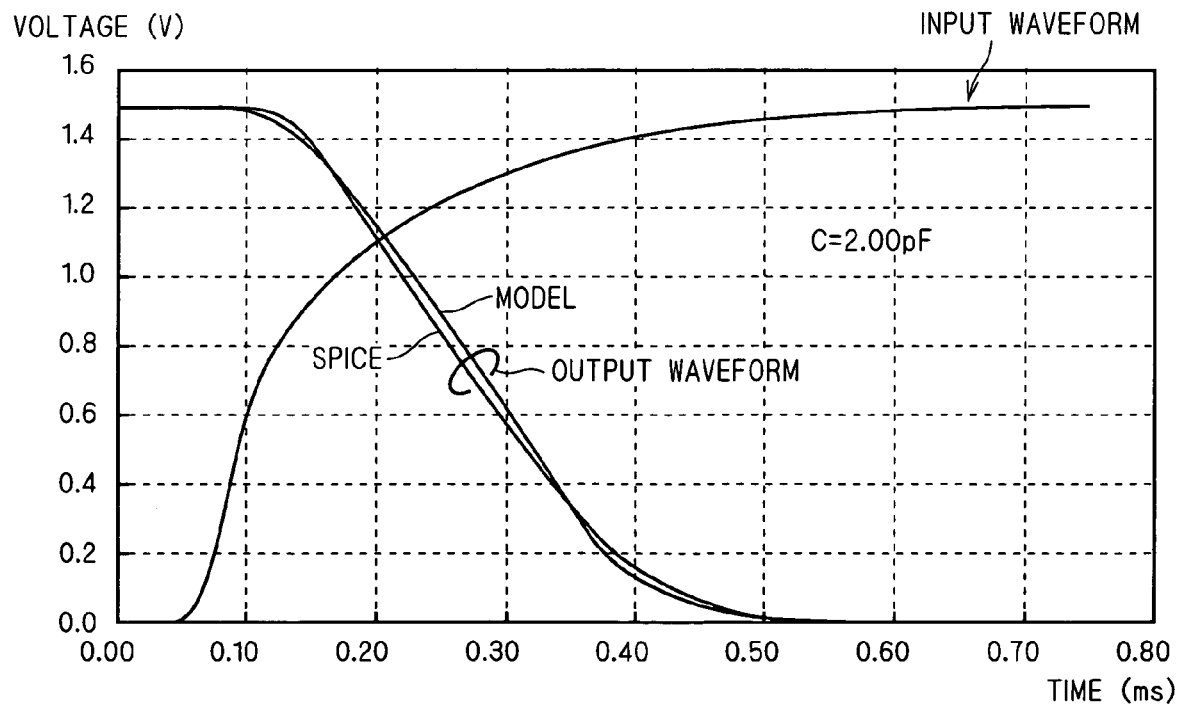

FIGS. 13 to 16 show the output waveform (model) calculated using the delay calculation method according to the preferred embodiment of the present invention, and the output waveform obtained through SPICE simulations. FIGS. 13 and 14 show the cases where the output load capacitance is small (C=0.05 pF), and FIGS. 15 and 16 show the cases where the output load capacitance is large (C=2.00 pF). For each of the small and large output load capacitances, calculations are made for two cases: the case where the waveform shape changes linearly (FIGS. 13 and 15); and the case where the waveform shape changes exponentially (FIGS. 14 and 16).

As shown in FIGS. 13 to 16, irrespective of any condition, the model and the SPICE show similar results. As shown in FIGS. 13 and 14, when the output load capacitance is small, the output waveform shape does not so much depend on the input waveform shape. Thus, the output waveforms in FIGS. 13 and 14 are generally similar in shape. This is because, since the charging of the output load is completed before the input waveform reaches Vdd, linear approximation of the input waveform leads to a good result.

In FIGS. 15 and 16, since the output load capacitance is large, the input waveform shape for the period before reaching Vdd influences the output waveform shape. As a result, the output waveforms in FIGS. 15 and 16 give different results.

In FIG. 15, the model output waveform and the SPICE output waveform have roughly the same shape and overlap each other.

From the above, it is found that the delay calculation method according to the preferred embodiment of the present invention allows accurate calculations of output waveforms by adopting input waveform information that gives the shapes of input waveforms. Since output waveforms can be calculated with accuracy, if a time difference between input and output waveforms is measured with, for example, 50% of Vdd, delay values can be calculated with a small margin of error.

The present invention appropriately divides, depending on load conditions, the case where the E(t) waveform can be determined by only Tslew and the case where the E(t) waveform cannot be determined by only Tslew. In the latter case, parameters are corrected using a difference in the mean gate voltage $\overline{Vgs}$ in the saturation region where the gate voltage is constant. Consequently, even in the case where different delay values are calculated from the same input Tslew value, accurate delay calculations are possible.

Also, using the technique for calculating the correction factor x for parameter correction causes virtually no increase in calculation time when compared with that in conventional delay calculation methods.

While the delay calculation method according to the preferred embodiment of the present invention employs a voltage source model that represents transistor operation by determining the E(t) waveform of the power supply, this method is also applicable to other delay calculation methods such as that employing a current source model. In the case of the current source model, instead of determining the E(t) waveform, a current source is set so as to directly output current waveforms as shown in FIG. 5. Even in this model's case, according to the same idea (that the mean gate voltage $\overline{Vgs}$ is calculated for parameter correction), it is possible to calculate saturation current (current in region II) with accuracy, and the use of such saturation current for calculation increases the accuracy of calculation.

While the invention has been shown and described in detail, the foregoing description is in all aspects illustrative and not restrictive. It is therefore understood that numerous modifications and variations can be devised without departing from the scope of the invention.

What is claimed is:

1. A delay calculation method for calculating a delay in a logic circuit including at least a MOS transistor, the delay calculation method comprising the steps of:
    modeling the transistor using: a resistance element whose resistance value is fixed, and a power supply whose voltage varies with time;
    determining a shape of a voltage waveform of said power supply based on input waveform information associated with a shape of an input waveform of said logic circuit;
    calculating, by using a machine, a delay in the logic circuit; and
    displaying or storing or outputting the calculated delay,
    wherein E(t) represents voltage waveform of said power supply, and
    wherein determining E(t) includes the steps of:
    (a) determining whether E(Tslew) is greater than or equal to E, wherein Tslew represents the time when the input waveform has finished its transition to 0 or Vdd and E represents a first constant voltage,
    (b) upon a determination that E(Tslew) is not greater than or equal to E, calculating a mean gate voltage,
    (c) using the mean gate voltage to calculate V1, wherein V1 represents a second constant voltage,
    (d) determining whether E(t0+Δt1+Δt2) is equal to E, wherein t0 defines a fixed delay time required for the input waveform to exceed a threshold voltage of the transistor, Δt1 defines the time required for E(t) to increase from 0 to V1, and Δt2 defines the time required for E(t) to increase from V1 to E, and
    (e) upon a determination that E(t0+Δt1+Δt2) is equal to E, determining the waveform shape of E(t).

2. The delay calculation method according to claim 1, wherein
    said input waveform information includes:
    information on potential of said input waveform at a time when a linear waveform that requires the same amount of time as said input waveform to transition between predetermined two potentials meets a power supply voltage or ground voltage which depends on whether said input waveform transitions from low to high or from high to low, respectively; and
    information on time constant of an exponential waveform which passes through said potential of said input waveform at said time and a higher or lower one of said predetermined two potentials which depends on whether said input waveform transitions from low to high or from high to low, respectively.

3. The delay calculation method according to claim 1, wherein
    operating characteristics of said transistor being modeled are represented as divided into a first region where current changes with changing gate potential, a second region where current decreases gradually while gate potential is constant, and a third region where current decreases while gate potential is constant,
    said second region corresponding to a saturation region of said transistor,
    said third region corresponding to a linear region of said transistor; and
    when said transistor transitions from said first region to said second region and then to said third region, the shape of said voltage waveform of said power supply is determined according to said input waveform information.

4. The delay calculation method according to claim 3, wherein
    a saturation current value of said transistor in said second region is calculated based on said input waveform information and is used to determine the shape of said voltage waveform of said power supply.

5. The delay calculation method according to claim 4, wherein
    said saturation current value is calculated according to a mean gate potential of said transistor in said second region.

* * * * *